United States Patent [19]

Mörz et al.

[11] Patent Number: 4,982,172

[45] Date of Patent: Jan. 1, 1991

[54] METHOD OF CREATING A MEASURING SIGNAL ACCESS TO A WAVEGUIDE ARRANGEMENT

[75] Inventors: Günter Mörz, Ludwigsburg; Konstantin Beis, Backnang; Klaus Junger, Allmersbach, all of Fed. Rep. of Germany

[73] Assignee: ANT Nachrichtentechnik GmbH, Backnang, Fed. Rep. of Germany

[21] Appl. No.: 410,868

[22] Filed: Sep. 22, 1989

[30] Foreign Application Priority Data

Sep. 22, 1988 [DE] Fed. Rep. of Germany ....... 3832187

[51] Int. Cl.$^5$ .......................... H01P 1/00; H01P 5/00
[52] U.S. Cl. ..................................... 333/248; 138/92; 324/632; 333/113
[58] Field of Search ............... 333/109, 113, 250, 248, 333/99 R; 324/629, 632, 637, 638, 642, 645, 646; 138/90, 92

[56] References Cited

U.S. PATENT DOCUMENTS

| | | | |
|---|---|---|---|
| 1,517,677 | 12/1924 | Heinkel | 138/92 X |
| 2,820,201 | 1/1958 | Tomiyasu | 333/113 X |
| 3,451,432 | 6/1969 | Miller | 138/90 |
| 3,550,637 | 12/1970 | Briden | 138/92 |
| 3,605,041 | 9/1971 | Judkins | 333/21 R X |
| 4,211,911 | 7/1980 | Dehn | 333/109 X |
| 4,433,313 | 2/1984 | Saint et al. | 333/109 |
| 4,801,903 | 1/1989 | Mohr | 333/113 |

OTHER PUBLICATIONS

Gerhard Megla, "Dezimeterwellentechnik", Berliner Union Stuttgart, 1962, pp. 320–329, 674–677, 714–717, 726–731.

*Primary Examiner*—Paul Gensler
*Attorney, Agent, or Firm*—Spencer & Frank

[57] ABSTRACT

A method of creating an access to a waveguide arrangement in order to couple measuring signals into and/or out of the waveguide arrangement includes providing a cover for covering an opening in a waveguide wall of the waveguide arrangement at a location suitable as a measuring signal access, removing the cover, and replacing the cover with another cover equipped with a coupling device.

9 Claims, 3 Drawing Sheets

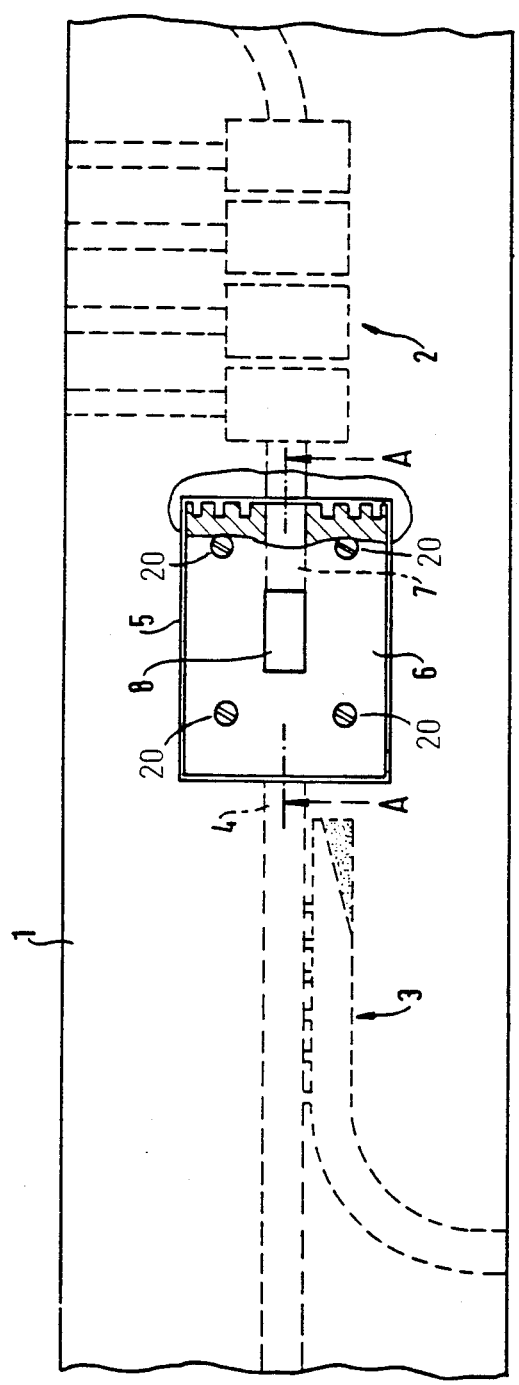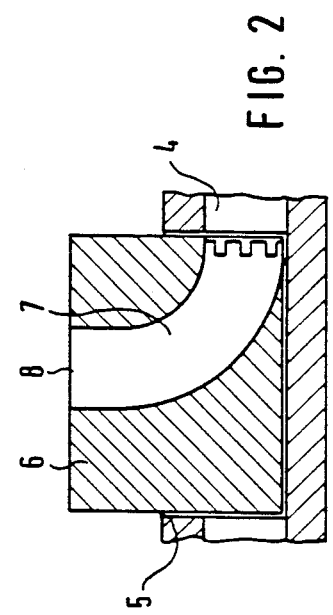

METHOD OF CREATING A MEASURING SIGNAL ACCESS TO A WAVEGUIDE ARRANGEMENT

CROSS REFERENCE TO RELATED APPLICATION

This application claims the priority of Application Ser. No. P 38 32 187.4 filed Sept. 22, 1988, in the Federal Republic of Germany, the subject matter of which is incorporated herein by reference.

BACKGROUND OF THE INVENTION

The present invention relates to a method of creating access to a waveguide for coupling measuring signals into or out of the waveguide.

In order to determine the electrical and magnetic characteristics of a waveguide arrangement, appropriate measurements must be made. A waveguide arrangement in this context may comprise a single waveguide, a waveguide component (e.g. a filter, mixer, coupler, circulator, etc.) or a complex integrated waveguide circuit. In order to measure such characteristics, measuring signals are initially coupled into the waveguide arrangement at an access point, and coupled out again at an end of the section of the waveguide arrangement in which the measurements are to be made, and from there fed to a measuring device. For reflection measurements, the coupling in and out occurs at the same access point.

SUMMARY OF THE INVENTION

It is now an object of the invention to provide a method which permits the creation of one or several measuring signal accesses to a waveguide arrangement with little expense for circuitry and time, and without having to completely disassemble the arrangement.

The above and other objects are accomplished according to the invention by the provision of a method of creating an access to a waveguide arrangement in order to couple measuring signals into and/or out of the waveguide arrangement which includes providing a cover for covering an opening in a waveguide wall of the waveguide arrangement at a location suitable as a measuring signal access; removing the cover; and replacing the cover with another cover equipped with a coupling device.

According to the method of the invention, it is only necessary, in order to create a measuring signal access, to remove an easily accessible cover at a side wall of the waveguide and replace it by a coupling device. After completion of the measuring process, the coupling device is removed and the opening in the side wall of the waveguide is closed again with its original cover. The coupling device can thus be re-used and can be employed for all types of measurements. This is a particular advantage if a waveguide arrangement is produced in large numbers.

Another aspect of the invention is the provision of an arrangement for implementing the foregoing method wherein the coupling device includes an input/output port, and a deflection element following the input/output port and projecting into the interior of the waveguide section without making contact with interior walls of the waveguide section for bringing measuring signals of a certain propagation direction out of the waveguide section to the input/output port and for bringing measuring signals fed into the input/output port into the waveguide section.

According to one embodiment the deflection device comprises a waveguide section which is curved in one of the E-plane and the H-plane. In a further embodiment the deflection device includes a curved molded member having a surface including wave blocking means for preventing propagation of waves in the gap formed between the molded member and interior walls of the waveguide section. In yet another embodiment, the coupling device includes a waveguide section which extends over a length of and parallel to the waveguide section of the waveguide arrangement that is to be subjected to a measuring process, and a side wall facing the interior of the waveguide section of the waveguide arrangement and provided with coupling openings such that the waveguide section of the coupling device together with the waveguide section of the waveguide arrangement form a directional coupler.

BRIEF DESCRIPTION OF THE DRAWINGS

The invention will now be described in greater detail with reference to several embodiments that are illustrated in the drawing figures.

FIG. 1 is a top view of a waveguide arrangement including a waveguide elbow for permitting measuring signal access according to one embodiment of the invention.

FIG. 2 is a longitudinal sectional view along line A—A through the waveguide elbow of FIG. 1.

DESCRIPTION OF THE PREFERRED EMBODIMENTS

Figure 3:
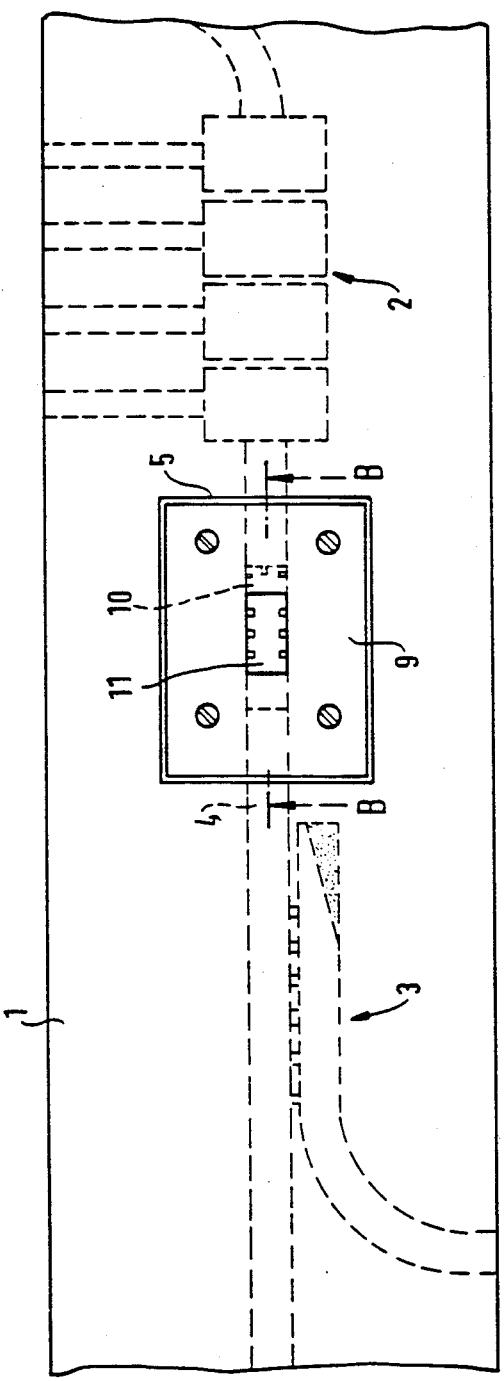
FIG. 3 is a top view of a waveguide arrangement including a molded deflection member for permitting measuring signal access according to another embodiment of the invention.

FIG. 1 is a top view of a section of a waveguide arrangement 1 which includes conventional components, for example, a multi-circuit filter 2 and a directional coupler 3 connected by a waveguide section 4. A measuring location is to be provided, for example, between filter 2 and directional coupler 3. For this purpose, an opening 5 is cut into an accessible upper sidewall of waveguide 4 which extends between filter 2 and directional coupler 3. This opening is normally closed by a removable cover.

If now a measurement is to be taken at this location, the cover is removed and a coupling device is inserted into opening 5. The coupling device serves to either couple a measuring signal into waveguide 4 which is then coupled out again at another location in the waveguide arrangement to complete the measurement, or to couple out a measuring signal that has been coupled in at some other location. Three embodiments for such a coupling device are described below.

FIGS. 1 and 2 show a coupling element comprised of a deflection element 6 which includes a waveguide elbow section 7 curved in the H-plane (or E-plane, respectively). Deflection element 6 enters into waveguide 4 without making contact with the interior walls of the waveguide and is secured in place, for example, by screws 20. Measuring signals of a certain propagation direction are either brought out of waveguide wave 4 through curved waveguide section 7 to an input/output port 8 of deflection element 6, or measuring signals fed into input/output port 8 are introduced into waveguide 4. The direction in which measuring signals are coupled in or from which measuring signals are coupled out depends on the direction of the curvature of waveguide section 7. Reversal of the direction is accomplished by simply reversing the orientation of deflection element 6 in waveguide 4. A blocking structure having a waffle-iron structure disposed at the frontal face of the end of curved waveguide section 7 and on either side of waveguide 4 prevents propagation of waves through the gap between deflection element 6 and waveguide 4.

Figure 4:
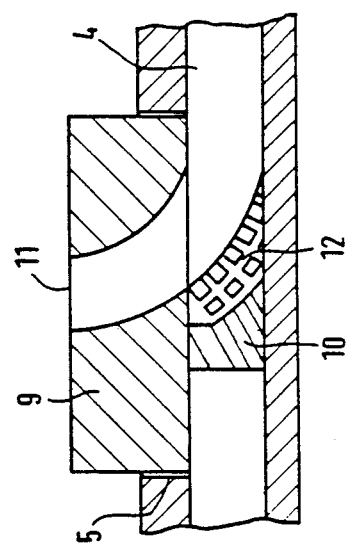
FIG. 4 is a longitudinal sectional view seen along line B—B through the molded deflection member of FIG. 3.

FIGS. 3 and 4 show another deflection element 9 which differs from deflection element 6 just described in that, instead of a curved waveguide section, only a curved molded member 10 projects into waveguide 4 without making contact with the waveguide interior walls. Measuring signals are brought out of waveguide 4 to an input/output port 11 of deflection element 9 through a bent upper side of molded member 10; or measuring signals are introduced into waveguide 4 through input/output port 11. Here again, a reversal in the orientation of deflection element 9 permits a reversal of the direction in which the signals are coupled in or out. A wave blocking structure 12, for example, in the form of a waffle iron structure, is cut into those side walls of molded member 10 which are immediately adjacent to the inner walls of waveguide 4. Wave blocking structure 12 prevents waves from propagating in the gaps between molded member 10 and the interior walls of the waveguide.

Figure 5:
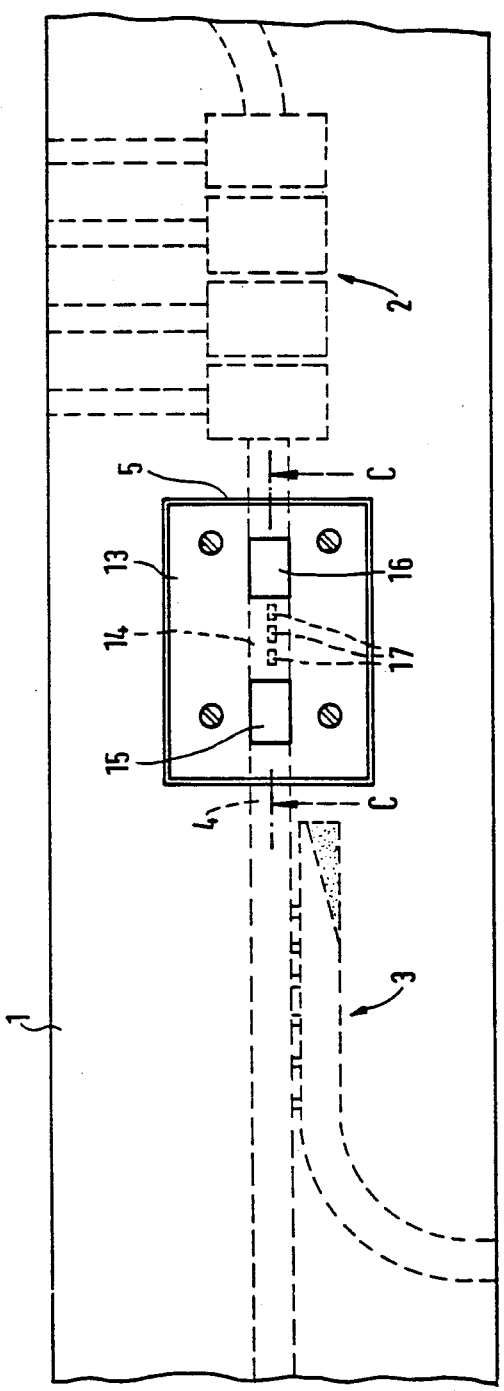
FIG. 5 is a top view of a waveguide arrangement including a directional coupler for permitting measuring signal access according to a further embodiment of the invention.
Figure 6:
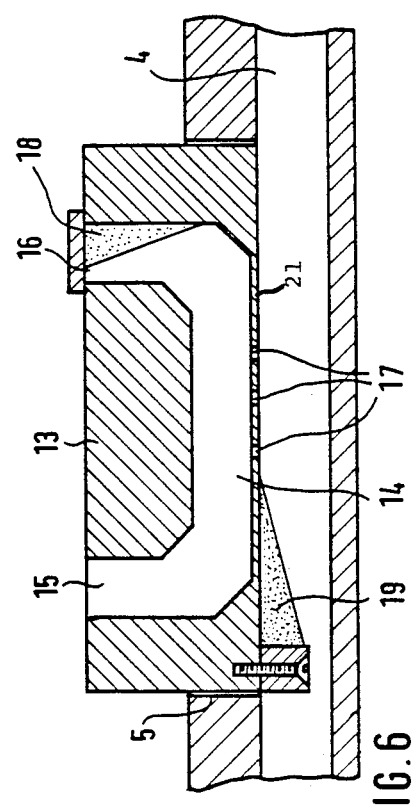
FIG. 6 is a longitudinal sectional view seen along line C—C of the directional coupler of FIG. 5.

FIGS. 5 and 6 show a coupling element 13 having the characteristics of a directional coupler. Coupling element 13 is inserted into opening 5 in waveguide 4 and includes a waveguide section 14 equipped with two input/output ports 15 and 16 extending over a certain length parallel to waveguide 4. A wall 21 of coupling element 13 separating it from waveguide 4 is provided with coupling openings 17. The length over which waveguide section 14 is parallel to waveguide 4 and the locations of the coupling openings 17 are selected so that, together with waveguide 4, waveguide section 14 forms a directional coupler. Such a directional coupler makes it possible to couple measuring signals in or out, or from both directions of waveguide 4. If necessary, that input/output port 15 or 16, which is not intended for coupling in and out measuring signals may be terminated by an absorber 18.

The propagation of measuring signals in an undesirable direction within waveguide 4 is prevented by way of an absorber 19 which is attached to the underside of coupling element 13 and projects into waveguide 4.

In connection with complex integrated waveguide circuits involving a large number of measuring locations, it would be time consuming if the measuring signal accesses had to be individually established one after the other. It is much less time consuming to replace the cover that is customarily provided in integrated waveguide circuits where it forms at least one side wall of the circuit to be integrated, by another cover according to the principles of the invention for the measuring process. This cover differs from the original cover only in that at the locations intended for the measurements it is equipped with coupling elements of the type described above. Such a cover equipped with a coupling element according to the invention can be employed for the measurement of any matching integrated waveguide circuit. An integrated waveguide circuit is usually a waveguide structure which is for instance molded or etched in a two-part (bareplate, coverplate) housing. Such a waveguide structure comprises possibly mm-wave components (e.g. mixers, oscillators, power amplifiers etc.).

Obviously, numerous and additional modifications and variations of the present invention are possible in light of the above teachings. It is therefore to be understood that within the scope of the appended claims, the invention may be practiced otherwise than as specifically claimed.

What is claimed is:

1. A method of creating an access to a waveguide section of a waveguide arrangement in order to couple measuring signals into and/or out of the waveguide arrangement, comprising:
   providing a removable cover for covering an opening in a waveguide wall of the waveguide arrangement at a location suitable as a measuring signal access;
   removing the cover; and
   replacing the cover with a coupling cover equipped with a coupling device for coupling measuring signals into and out of the waveguide arrangement.

2. A method according to claim 1, wherein said replacing step includes replacing the removable cover with a coupling device cover that is as large as the removable cover it replaces.

3. An arrangement for implementing the method of claim 1, wherein said coupling cover comprises:
   an input/output port; and
   deflection means following said input/output port and projecting into the interior of the waveguide section of the waveguide arrangement without making contact with interior walls of the waveguide section for bringing measuring signals of a certain propagation direction out of the waveguide section to the input/output port and for bringing measuring signals fed into the input/output port into the waveguide section.

4. An arrangement for implementing the method defined in claim 1, wherein said coupling cover comprises:
   a waveguide which extends over a length of and parallel to the waveguide section of the waveguide arrangement that is to be subjected to a measuring process; and
   a side wall of the waveguide facing the interior of the waveguide section of the waveguide arrangement is provided with coupling openings such that the waveguide of the coupling cover together with the waveguide section of the waveguide arrangement form a directional coupler.

5. A method of creating at least one access to an integrated waveguide circuit in order to couple measuring signals into and/or out of the integrated waveguide circuit, the integrated waveguide circuit having a plurality of waveguides at least some of which have a side wall formed by a removable cover disposed at a waveguide location suitable as a measuring signal access, said method comprising;
   removing one of the removable covers and replacing it with a cover equipped with a coupling device for coupling measuring signals into and/or out of the waveguide circuit.

6. A method of creating an access to a waveguide section of a waveguide arrangement in order to couple measuring signals into and/or out of the waveguide arrangement, comprising:

providing a cover for covering an opening in a waveguide wall of the waveguide arrangement at a location suitable as a measuring signal access;

removing the cover; and replacing the cover with another cover equipped with a coupling device, wherein said coupling device comprises an input/output port, and deflection means including a waveguide section which is curved in one of the E-plane and the H-plane, and said deflection means follows said input/output port and projects into the interior of the waveguide section of the waveguide arrangement without making contact with interior walls of the waveguide section for bringing measuring signals of a certain propagation direction out of the waveguide section to the input/output port and for bringing measuring signals fed into the input/output port into the waveguide section.

7. A method of creating an access to a waveguide section of a waveguide arrangement in order to couple measuring signals into and/or out of the waveguide arrangement, comprising:

providing a cover for covering an opening in a waveguide wall of the waveguide arrangement at a location suitable as a measuring signal access;

removing the cover; and replacing the cover with another cover equipped with a coupling device having an input/output port and deflection means following said input/output port and projecting into the interior of the waveguide section of the waveguide arrangement without making contact with interior walls of the waveguide section for bringing measuring signals of a certain propagation direction out of the waveguide section to the input/output port and for bringing measuring signals fed into the input/output port into the waveguide section, wherein said deflection means comprises a waveguide elbow section having a frontal face at the end of said elbow section and a blocking structure in the form of a waffle-iron structure disposed at said frontal face and on either side of the waveguide section of the waveguide arrangement for preventing propagation of waves through the gap formed between said elbow section and the waveguide section of the waveguide arrangement.

8. A method of creating an access to a waveguide section of a waveguide arrangement in order to couple measuring signals into and/or out of the waveguide arrangement, comprising:

providing a cover for covering an opening in a waveguide wall of the waveguide arrangement at a location suitable as a measuring signal access;

removing the cover; and replacing the cover with another cover equipped with a coupling device comprising an input/output port and deflection means following said input/output port and projecting into the interior of the waveguide section of the waveguide arrangement without making contact with interior walls of the waveguide section for bringing measuring signals of a certain propagation direction out of the waveguide section to the input/output port and for bringing measuring signals fed into the input/output port into the waveguide section, wherein said deflection means comprises a curved molded member having a surface including wave blocking means for preventing propagation of waves in the gap formed between said molded member and interior walls of the waveguide section.

9. An arrangement as defined in claim 8, wherein said wave blocking means comprises a waffle-iron structure inserted into the surface of said molded member.

* * * * *